United States Patent
Kumar

(10) Patent No.: US 8,146,023 B1
(45) Date of Patent: Mar. 27, 2012

(54) INTEGRATED CIRCUIT FABRICATION PROCESS CONVERGENCE

(75) Inventor: Bhavani P. Kumar, Kanchipuram (IN)

(73) Assignee: KLA-Tenor Corporation, Milpitas, CA (US)

( * ) Notice: Subject to any disclaimer, the term of this patent is extended or adjusted under 35 U.S.C. 154(b) by 330 days.

(21) Appl. No.: 12/565,787

(22) Filed: Sep. 24, 2009

Related U.S. Application Data

(60) Provisional application No. 61/102,274, filed on Oct. 2, 2008.

(51) Int. Cl.
G06F 17/50 (2006.01)
G06F 11/22 (2006.01)

(52) U.S. Cl. .......................................... 716/51; 716/136

(58) Field of Classification Search .................. 716/136, 716/51
See application file for complete search history.

(56) References Cited

U.S. PATENT DOCUMENTS

| | | | |
|---|---|---|---|
| 7,266,801 B2 * | 9/2007 | Kotani et al. | 716/52 |
| 7,284,231 B2 * | 10/2007 | Lucas et al. | 716/53 |
| 7,570,796 B2 | 8/2009 | Zafar et al. | |
| 2005/0251771 A1 * | 11/2005 | Robles | 716/5 |
| 2006/0095887 A1 * | 5/2006 | Bigwood et al. | 716/19 |
| 2006/0136861 A1 * | 6/2006 | Lucas et al. | 716/21 |
| 2006/0206851 A1 * | 9/2006 | Van Wingerden et al. | 716/19 |
| 2007/0157153 A1 * | 7/2007 | Croffie et al. | 716/21 |

* cited by examiner

*Primary Examiner* — Stacy Whitmore
*Assistant Examiner* — Magid Dimyan
(74) *Attorney, Agent, or Firm* — Luedeka Neely Group, P.C.

(57) ABSTRACT

A method for selecting a process for a new integrated circuit design. Structures that are used in existing integrated circuit designs are identified, as well as the photolithography processes that are used to fabricate integrated circuits that are based on the existing designs. A process window is determined for each structure/process combination by running tests on different combinations of process variables, and a database of the process windows is compiled. The structures that are to be used in the new integrated circuit design are identified, and the process windows associated with the identified structures for the new integrated circuit design are selected from the database. The selected process windows for the identified structures are overlaid, grouped by common process, thereby creating a resultant process window for each process. One of the processes is selected, based at least in part on comparative sizes of the resultant process windows.

8 Claims, 4 Drawing Sheets

INTEGRATED CIRCUIT FABRICATION PROCESS CONVERGENCE

FIELD

This application claims all rights to and priority on co-pending U.S. provisional patent application Ser. No. 61/102,274 filed 2008 Oct. 2. This invention relates to the field of integrated circuits. More particularly, this invention relates to methods for reducing the time required to determine processing parameters for new integrated circuit designs.

BACKGROUND

Integrated circuits are formed from an extremely large number of small structures, which are layered one upon another in repetitively applied pattern transfer and pattern development operations. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

When a new integrated circuit design is produced, it is first designed in a computerized model. From this computerized model, the reticles that are used for the pattern transfer processes (such as photolithographic processes) are created. Once the reticles have been fabricated, the pattern transfer processes are qualified, to determine the most desirable process to be used for each layer. Several important steps selectively occur during this qualification process. For example, for a given mask layer, different types of photoresist might be investigated to see how they perform for that mask layer. Each photoresist investigated might be applied at different thicknesses, bake times, etc.

By way of further example, other layers can also used in different pattern transfer processes, such as anti-reflective coatings (bottom anti-reflective coating and top anti reflective coating). Illumination parameters such as source type, source shape, and illumination wavelengths are additional variable parameters. With the complexities that are present in some patterns, optical correction might need to be applied to the pattern to ensure proper pattern transfer. There can also be different types of optical correction models applied to the pattern. Such different combinations of parameters are generally referred to as a "process" herein.

Further, each process for each reticle layer is also investigated for how well the process forms the integrated circuit pattern at different combinations of exposure and focus. Acceptable ranges of exposure and focus for a given process are generally referred to as the "process window." Within the process window, the structures to be formed with a given reticle are properly constructed. Outside of the process window, at least some of the structures will exhibit some type of defect. A relatively larger process window indicates that there is greater latitude for variance of the exposure and focus parameters during processing, and is generally regarded as a good thing. A relatively smaller process window indicates that there is less latitude for variance of the exposure and focus parameters during processing, and is generally regarded as a bad thing.

Investigating the various processes and the windows for each process for each mask layer is a tremendously labor intensive undertaking, and thus is extremely expensive. However, this process is performed for every integrated circuit design that is put into production.

What is needed, therefore, is a system for reducing the amount of time required for qualifying the processes for new integrated circuit designs.

SUMMARY

The above and other needs are met by a method for selecting a process for a new integrated circuit design. Structures that are used in existing integrated circuit designs are identified, as well as the photolithography processes that are used to fabricate integrated circuits that are based on the existing designs. A process window is determined for each structure/process combination by running tests on different combinations of process variables, and a database of the process windows is compiled. The structures that are to be used in the new integrated circuit design are identified, and the process windows associated with the identified structures for the new integrated circuit design are selected from the database. The selected process windows for the identified structures are overlaid, grouped by common process, thereby creating a resultant process window for each process. One of the processes is selected, based at least in part on comparative sizes of the resultant process windows.

In this manner, the qualification information that is placed into the database only needs to be generated once, and then when new designs are to be qualified, the information from the database can be extracted and used to determine the new resultant process window, without running all new process qualification tests.

In various embodiments according to this aspect of the invention, there is an additional step of confirming the selected process by running tests on the new integrated circuit design using process parameters based at least in part on the resultant process window. In some embodiments the structure associated with the process window that most limits a size of the resultant process window is selected as a monitor structure. In some embodiments the process variables include exposure and focus.

According to another aspect of the invention there is described a processor-based method for selecting a process for a new integrated circuit design. The structures that are to be used in the new integrated circuit design are identified. Process windows associated with the identified structures for the new integrated circuit design are selected from a database of process windows for structure/process combinations. Using the processor, the selected process windows for the identified structures are overlaid, grouped by common process, thereby creating a resultant process window for each process. One of the processes is selected, based at least in part on comparative sizes of the resultant process windows.

In various embodiments according to this aspect of the invention, the selected process is confirmed by running tests on the new integrated circuit design using process parameters based at least in part on the resultant process window. In some embodiments the structure associated with the process window that most limits a size of the resultant process window is selected as a monitor structure. In some embodiments, the structure associated with the process window that most limits the size of the resultant process window is recommended for re-design. In some embodiments the process variables for the process windows include exposure and focus.

BRIEF DESCRIPTION OF THE DRAWINGS

Further advantages of the invention are apparent by reference to the detailed description when considered in conjunc

DETAILED DESCRIPTION

The various embodiments of the present invention dramatically reduce the amount of work that is needed for the process qualification of a new integrated circuit design, by creating a data base of qualification information that is applicable to new integrated circuit designs. This is possible because new integrated circuit designs do not tend to require completely new basic structures—which are the building blocks of the integrated circuit. Instead, new integrated circuit designs tend to arrange standard basic structures into different patterns and combinations. Thus, the embodiments of the present invention develop process qualification data for individual structures, which can then be applied to new integrated circuit designs which incorporate those structures, as described in more detail below.

Overview

Figure 1:
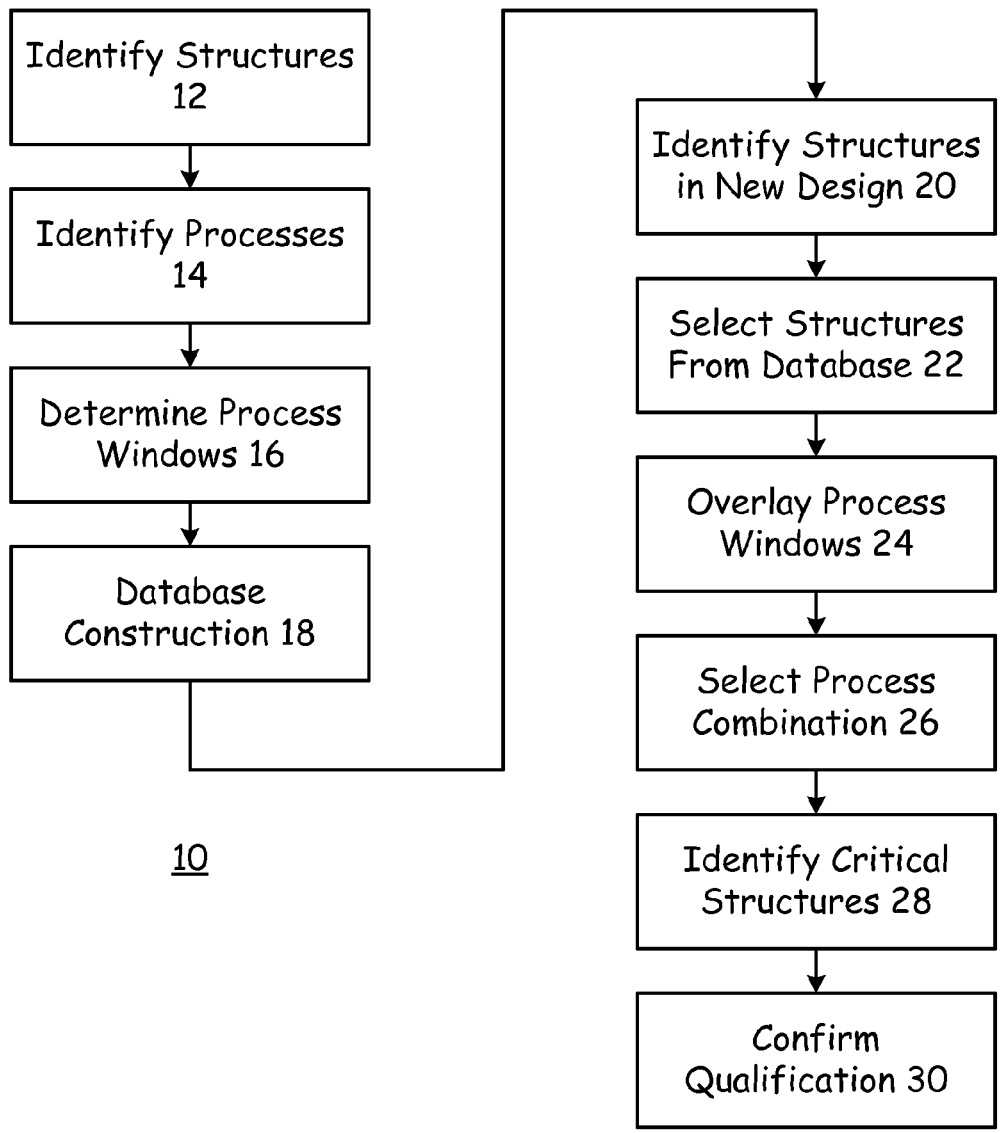
- FIG. 1 is a flow chart for a method according to an embodiment of the present invention.

With reference now to FIG. 1, a brief overview of an embodiment according to the present invention is now presented. It is appreciated that various combinations and alterations of the steps as described are contemplated.

The first step of the embodiment as depicted is to identify all of the different basic structures that are used for the various integrated circuit designs, as given in block 12. All of the different photolithography processes are also identified, as given in block 14. These two different factors, basic structures and photolithography processes, define two degrees of a matrix of different structure/process combinations. The process window (in terms of exposure and focus) for each structure/process combination is determined, as given in block 16, and these qualification records are placed into a database, as given in block 18. This constitutes a first, preparatory portion of the overall method, which in one embodiment only needs to be performed once, with new structure/process combination added to the database as they are developed.

In a second, application portion of the overall method, the structures that are to be used in a specific new integrated circuit design are identified, as given in block 20. The qualification records for these structures are drawn from the database, as given in block 22. The process windows for the structure/process combinations are compared one to another, as given in block 24, to determine which combinations provide adequate combined process windows. A desired combination of processes for the structures is selected, as given in block 26, based on a variety of different goals.

In some embodiments, one or more of the structures in the integrated circuit design is selected as a critical structure for monitoring the process during production, as given in block 28. In some embodiments, the process is qualified using the resultant process window as a starting point, as given in block 30. In some embodiment, this second part of the overall method is the only part that needs to be performed to qualify a new integrated circuit design, and thus dramatically reduces the time required to qualify the processes for the new design. In some embodiment, recommendation on re-design of this critical structure is proposed even before the manufacture of the reticle, thus resulting in reduced time, cost, and effort of the process qualification The steps of the method as introduced above are now described with more detail.

Identify Structures

The basic structures include elements such as specific designs for different layers of resistors, capacitors, transistors, and other elements. However, larger structures, such as a flip flop, buffer, or other combinations of more basic structures are often used without modification from one integrated circuit design to another. Further, even larger structures, such as a memory block or gate array, are also repeatedly used in different integrated circuit designs without any modification from one design to the next. One goal of this step is identify those structures, whether they be individual elements or large combinations of individual elements, that are reused from one integrated circuit design to another. In some embodiments it will be most beneficial to identify the largest structures that are reused, as it might reduce the amount of work that will be required during subsequent steps of the process.

Identify Processes

A variety of different lithographic processes might be available for use. For example, different photoresists might be available for use, and different application techniques, thicknesses, bake temperatures, and bake times can be applied to those photoresists. In addition, different anti-reflective coatings used in conjunction with photoresist and corresponding parameters, illumination source type, shape, and wavelength, optical correction models and types used, are also the various parameters which ensure proper pattern transfer. Those processes that are available for use are identified.

Once both the different structures and the different processes have been identified, a matrix can be formed of all of the desired combinations of structures and the pattern transfer processes that can reasonably be used to form the structures. Some processes might be known to not work well with some structures, and so those structure/process combinations could be eliminated from the matrix.

Determine Process Windows

Figure 2:
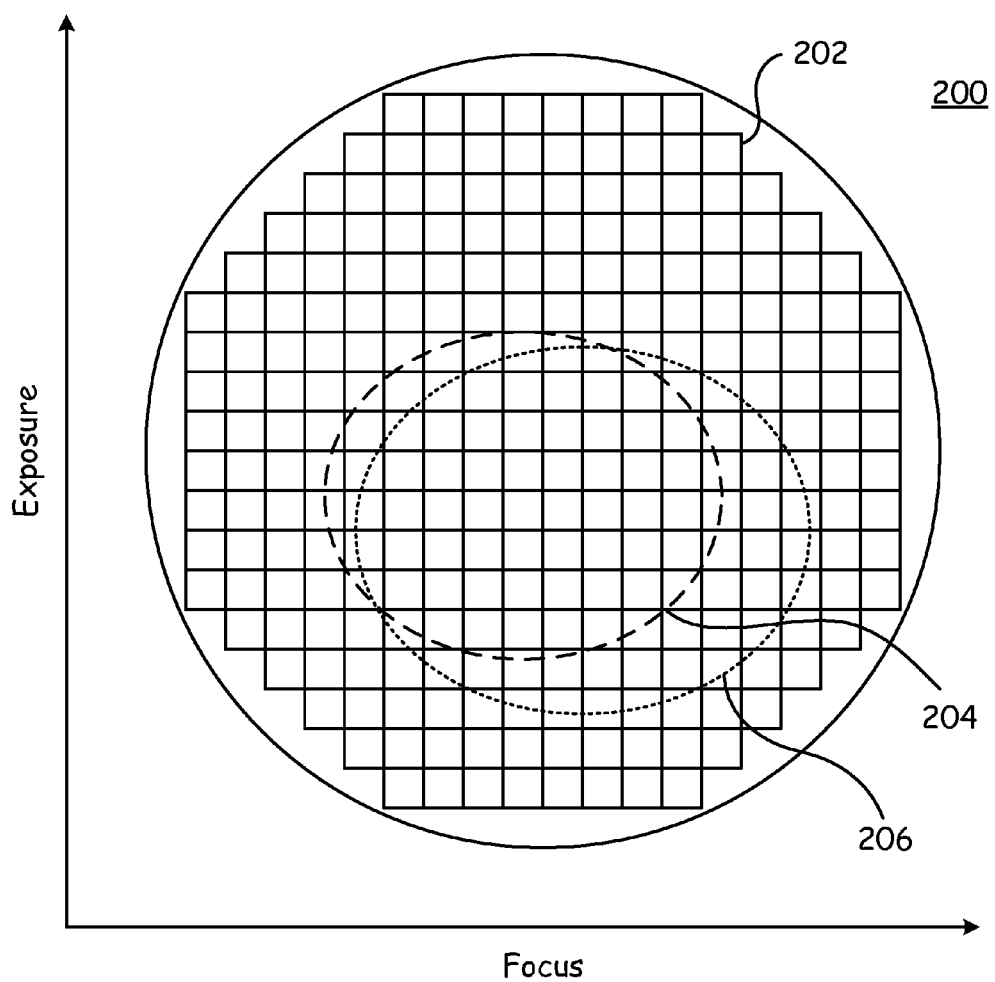
FIG. 2 depicts a focus-exposure test matrix substrate according to an embodiment of the present invention.

The process window for each structure/process combination is determined in one embodiment by using a focus-exposure matrix test substrate 200, as depicted in FIG. 2. The test substrate 200 is a substrate of the type that is used for the fabrication of production integrated circuits, such as a silicon wafer. In one embodiment, a single die pattern 202 is repeatedly printed across the substrate 200 using one of the identified processes. In one direction, the X direction for example, the focus settings are varied, such as from a relatively low value to a relatively high value. In another direction, the Y direction for example, the exposure settings are varied, such as from a relatively low value to a relatively high value. The die pattern 202 in one embodiment contains at least one of the structures that was identified in the previously-described step. In one embodiment, the die pattern 202 is a test die pattern that contains a representative sampling of all of the structures that are needed to qualify the process and determine the process window. In the example as depicted in FIG. 2, the die pattern 202 contains two of the structures.

The substrate 200 is processed according to one of the pattern transfer processes as desired, with the exposure and focus changed from die 202 to die 202. The substrate 200 is developed and baked, and perhaps further processed such as by etching, so that the formation of the structures printed thereon can be investigated. Those die 202 on the substrate 200 that have structures that are defective are marked as such. Those die 202 on the substrate 200 that do not have defective structures define those settings of focus and exposure that lie within the window for that structure/process combination.

A structure/process qualification window frame, such as 204 and 206, can be drawn on the chart for each structure/process combination. Inside of the frame 204 and 206 are those die 202 that do not have any defects as a result of the variation of focus and exposure. For example, qualification window frame 204 represents the process window for a first of the two structures represented within each die 202. None of the first structures within the frame 204 exhibit any defects. Similarly, qualification window frame 206 represents the process window for a second of the two structures represented within each die 202. None of the second structures within the frame 206 exhibit any defects.

Figure 3:
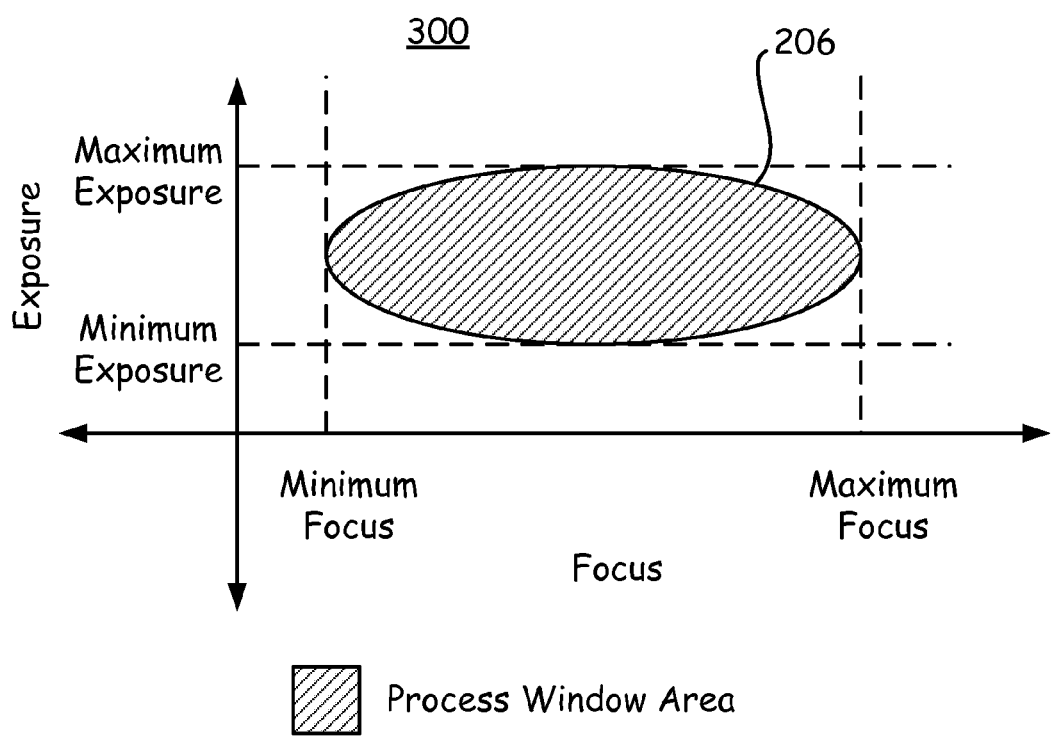
FIG. 3 depicts a chart of a process window according to an embodiment of the present invention.

If several different structures are represented within the test die 202, then several different qualification window frames can be determined by a single qualification substrate 200. The process windows 204 and 206 can be transferred from the map of the substrate 200 to a chart 300, as depicted in FIG. 3.

If several structures were included in the die pattern for the test substrate 200, then a process window chart 300 can be constructed for each one of the structures included in the die pattern. This process can be repeated for each of the lithographic processes to be investigated, and a process window chart 300 can be constructed for each desired structure/process combination.

Database Construction

The relevant information from all of the process window charts 300 is extracted and placed into a database. The relevant information in one embodiment includes items such as a designation of the structure, a designation of the process, the minimum and maximum values of the process window for the focus for that structure/process combination, and the minimum and maximum values for the exposure for that structure/process combination.

Once this database is completed, the first portion of the method according to this embodiment is completed, in that all of the desired structure/process combinations have been qualified. This database can then be used as a starting point for the qualification of new integrated circuit designs that use the qualified structures and processes.

Identify Structures in New Design

This step is the first step in the second portion of the method according to this embodiment, which second portion is used for qualifying the pattern transfer processing for new integrated circuit designs. This starts by identifying the standardized structures that are used in the new integrated circuit design. As mentioned above, it is possible that all of the structures used in the new design have been selected from standard libraries, and that all of the structures in the new design have already been qualified with different processes according to the first portion of the method, as described above. However, even in those cases where the new design includes structures that have not already been qualified, the process windows for those qualified structures that are included in the new design will help to reduce the new work of qualification.

Select Structures from Database

Once the structures are identified, the qualification data for the identified structures is pulled from the database. In one embodiment, the qualification data for every process investigated for that structure is pulled for use in the subsequent steps for the method, and in other embodiments only a selection of the processes investigated for that structure are selected. The difference lies, for example, in what a process design engineer might already know about how appropriate a given process might be in forming the structures in the new integrated circuit design.

Overlay Process Windows

Figure 4:
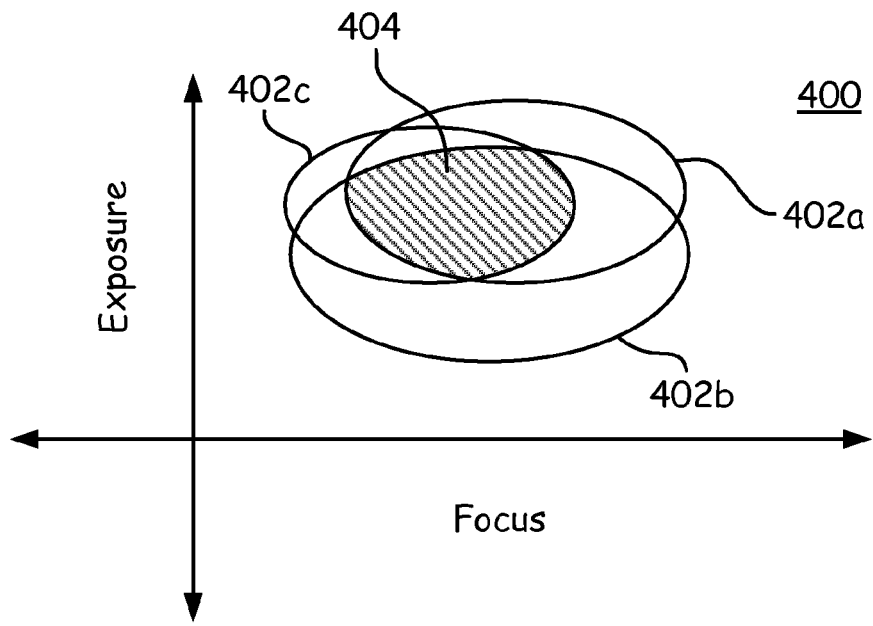
FIG. 4 depicts an overlay chart of several structure/process window frames and a resultant process window according to an embodiment of the present invention.

The process windows for the selected structure/process combinations are then overlaid, one on another. This can be done either graphically, as depicted in FIG. 4, or logically by a mathematical comparison of the window values in the database. The graphical representation provided by the overlay chart 400 of FIG. 4 is instructive for describing the process. As can be seen, three different process windows 402 for a given reticle layer are drawn onto the same chart 400. In some embodiments the actual number of overlaid process windows 402 might be much greater than three, but this number is sufficient to explain the concept. The portion 404 of the charted field that is enclosed by all three of the process windows 402 represents those process conditions of exposure and focus in which all of the structures are qualified for the given process.

It is appreciated that the process must be the same for all of the structures, as they will all be formed with the same mask layer, and therefore must be formed with the same process. However, a different overlay chart 400 can be constructed for each process, so as to determine which process has the largest resultant process window 404 associated with it. In one embodiment, all of the structures that are present in a given mask layer are overlaid on the chart 400 to determine the resultant process window 404.

Select Process Combination

Not all process windows 402 for a given process will overlap with all others. Thus, this step includes discarding those processes that make the overall process window 404 too restricted—or impossible to satisfy. However, in the final chart 400, every structure must be represented by one process window 402, and all of the processes must be the same process. The area 404 within all of the different structure/process frames 402 represents the acceptable process window for that reticle layer. Conditions for the given process outside of the common area 404 will produce defects in some of the structures, while the conditions for the given process inside of the common area 404 will produce structures that are all defect-free.

Identify Critical Structures

Figure 5:
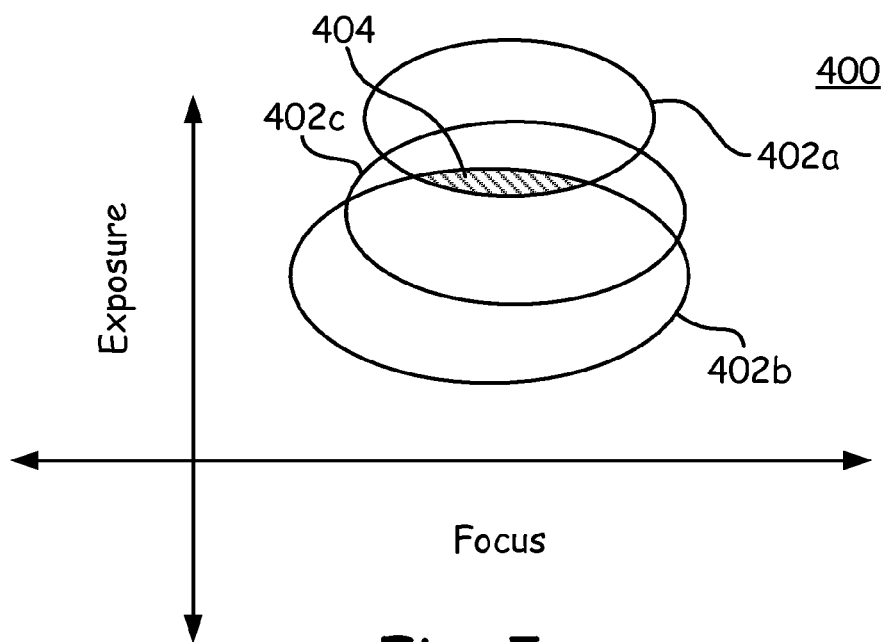
FIG. 5 depicts an overlay chart having a relatively small resultant process window, identifying a possible structure for production monitoring according to an embodiment of the present invention.

With reference now to FIG. 5, there is depicted an overlay chart 400, where one of the structure/process frames 402*a* overlaps with the others in a manner such as to restrict the size of the overall process window 404 more severely than any one of the other structure/process frames 402*b* and 402*c*. However, this combination might be the best combination that is found, or might be the only combination with any process window 404 at all. The structures represented by this restricting structure/process frame 402*a* can be selected, in one embodiment, for on-going monitor of the process once it is implemented for production devices, because these structures might be very sensitive to process excursions.

Confirm Qualification

In some embodiments, these resultant process windows 404 are used as a starting point for investigating what is likely to be the actual window for the identified process. Thus, tests could be performed with settings in and around those identified by the resultant process window 404, to confirm that the process can be performed at or near the identified settings. In this manner, the resultant process window 404 is not used as the final process window, but is used to dramatically narrow the scope of the investigation that is subsequently performed to qualify the process for the new integrated circuit design. In other embodiments, the resultant process window 404 is used as the final process window for the new integrated circuit design.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A processor-based method for qualifying a process for a new integrated circuit design, the method comprising the steps of:
   identifying structures that are used in existing integrated circuit designs,
   identifying photolithography processes that are used to fabricate integrated circuits that are based on the existing designs,
   determining a process window for each structure/process combination by running tests on different combinations of process variables,
   compiling a database of the process windows,
   identifying the structures that are to be used in the new integrated circuit design,
   selecting from the database the process windows associated with the identified structures for the new integrated circuit design,
   using the processor, overlaying the selected process windows for the identified structures, grouped by common process, thereby creating a resultant process window for each process, and
   selecting one of the processes based at least in part on comparative sizes of the resultant process windows.

2. The method of claim 1, further comprising the step of confirming the selected process by running tests on the new integrated circuit design using process parameters based at least in part on the resultant process window.

3. The method of claim 1, further comprising selecting as a monitor structure the structure associated with the process window that most limits a size of the resultant process window.

4. The method of claim 1, wherein the process variables comprise exposure and focus.

5. A processor-based method for qualifying a process for a new integrated circuit design, the method comprising the steps of:
   identifying the structures that are to be used in the new integrated circuit design,
   selecting process windows associated with the identified structures for the new integrated circuit design from a database of process windows for structure/process combinations,
   using the processor, overlaying the selected process windows for the identified structures, grouped by common process, thereby creating a resultant process window for each process, and
   selecting one of the processes based at least in part on comparative sizes of the resultant process windows.

6. The method of claim 5, further comprising the step of confirming the selected process by running tests on the new integrated circuit design using process parameters based at least in part on the resultant process window.

7. The method of claim 5, further comprising selecting as a monitor structure the structure associated with the process window that most limits a size of the resultant process window.

8. The method of claim 5, wherein process variables for the process windows comprise exposure and focus.

* * * * *